United States Patent [19]

Hannaford

[11] Patent Number: 4,884,070

[45] Date of Patent: Nov. 28, 1989

[54] METHOD AND APPARATUS FOR MULTIPLEXING SWITCH SIGNALS

[75] Inventor: Blake Hannaford, South Pasadena, Calif.

[73] Assignee: California Institute of Technology, Pasadena, Calif.

[21] Appl. No.: 176,871

[22] Filed: Apr. 4, 1988

[51] Int. Cl.[4] .............................................. H04Q 9/00
[52] U.S. Cl. ......................... 340/825.78; 340/870.38; 341/26
[58] Field of Search ....................... 340/825.77, 825.78, 340/825.38, 870.38; 341/22, 26, 20; 178/18, 20

[56] References Cited

U.S. PATENT DOCUMENTS

| | | | |
|---|---|---|---|
| 3,906,369 | 9/1975 | Pitman et al. | 341/20 |
| 4,118,700 | 10/1978 | Lenihan | 340/524 |
| 4,458,238 | 7/1984 | Learn | 341/20 |
| 4,580,138 | 4/1986 | Morrison | 340/825.78 |

OTHER PUBLICATIONS

Belove, C., *Handbook of Modern Electronics and Electrical Engineering*, pp. 924–926, John Wiley & Sons, New York, 1986.

Fink, D. G. and D. Christiansen, *Electronic Engineers Handbook*, pp. 8-71—8-74, McGraw Hill, New York, 1982.

Landee, R. W., D. C. Davis, A. P. Albrecht, and L. J. Giacoletto, *Electronics Designer's Handbook*, pp. 20-7-1—20-74, McGraw Hill, New York, 1977.

Rhyne, V. T., *Fundamentals of Digital Systems Design*, p. 504, Prentice Hall, New York, 1973.

Sheingold, D. H., *Analog-Digital Conversion Handbook*, pp. II-36—II-39, Analog Devices, Inc., Norwood, Mass., 1972.

Bekey, G. A. and W. J. Karplus, *Hybrid Computation*, pp. 27–28, John Wiley & Sons, New York, 1968.

Susskind, A. K., *Analog-Digital Conversion Techniques*, pp. 5-46—5-47, MIT Press & John Wiley & Sons, 1962.

Huskey, H. D. and G. A. Korn, *Computer Handbook*, pp. 18-44—18-45, McGraw Hill, New York, 1962.

*Primary Examiner*—Donald J. Yusko
*Assistant Examiner*—Edwin C. Holloway, III
*Attorney, Agent, or Firm*—Freilich, Hornbaker, Rosen & Fernandez

[57] ABSTRACT

Apparatus for multiplexing switch state signals comprises a plurality of switches and parallel weighted resistors connected in series between circuit ground and a node at a utilization device. The resistors are weighted as a function of a power of the same base, such as the power of the base 2, for coding the multiplexed switch state signals. A constant current source connected between the node and circuit ground drives current over a single cable conductor through the resistor. Each switch may be independently closed to change the switch state voltage signals multiplexed to the node. An analog-to-digital converter connected between the node and circuit ground demultiplexes the switch state signals received at the node and provides a switch state signal at each analog-to-digital output corresponding to the state of the switches at the moment. A potentiometer may replace a resistor and bypass switch combination in a position where the potentiometer has a maximum value of the lowest power of the base in order to multiplex a true analog voltage signal while switch state signals are unambiguously coded and multiplexed. The potentiometer in the least significant position permits the analog value to be in the range from 0 to a maximum corresponding to the least significant position of the switch state encoding. The invention may be used in redundancy systems by duplicating the invention with corresponding switches in each duplication ganged to open and close simultaneously upon operation of a pushbutton switch.

4 Claims, 2 Drawing Sheets

METHOD AND APPARATUS FOR MULTIPLEXING SWITCH SIGNALS

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

This invention relates to multiplex telegraphy, and more particularly to method and apparatus for multiplexing switch state signals from a handheld control device over a single conductor, such as for multiplexing control switch states to a robot over a cable.

BACKGROUND ART

In many applications, such as telerobotics, a handheld device is used to control many different functions of electromechanical apparatus. A hand-held control device (box or handgrip) is often provided with push buttons and/or switches to be actuated by an operator. For example, moving a toggle switch or moving a push button switch, and the like, controls special functions of a robot such as to grasp or release, lock or release current position, and emergency stop or resume. Thus, the handheld controller has a multiplicity of control functions which are transmitted to the controlled apparatus over a cable. Because of space, weight, and other constraints, it is often desirable to reduce the number of conductors in this cable to a minimum.

STATEMENT OF THE INVENTION

Accordingly, it is an object of the invention to provide a single conductor for transmitting a signal conveying information as to the state (open or closed) of a plurality of switches, one or more of which may be simultaneously actuated from one position to a second position.

A further objective is to provide for demultiplexing the signal received over a single conductor in order to provide the information as to which of the plurality of switches have been actuated to the second position.

These and other objects and advantages of this invention are achieved by providing a digital-to-analog converter in a handheld control device, and providing switches to enter binary control information, such as stop/resume, forward/backward. The output of the digital-to-analog converter is connected to a single conductor which extends into electromechanical apparatus to be controlled, where an analog-to-digital converter demultiplexes the information as to the position of the switches in the control device so that the apparatus will respond to the switch position of each switch.

In this digital-to-analog converter, the circuit employed applies a voltage reference and senses the analog output at the same circuit node. This is accomplished by weighted resistors connected in series between the circuit node and circuit ground, and a separate switch connected in parallel with each resistor. In that manner, the circuit can be used to multiplex switch signals over the single conductor without active components in the handheld control device.

Because the manual input to the digital-to-analog converter is a pattern of switch states (open or closed), and not a binary representation of a value, traditional concerns in digital-to-analog design, such as linearity, are not important. The only design requirement is that each switch state must be able to be identified (uniquely decoded into its state) by the demultiplexer (analog-to-digital) converter at the apparatus to be controlled.

DETAILED DESCRIPTION OF THE INVENTION

Figure 1:
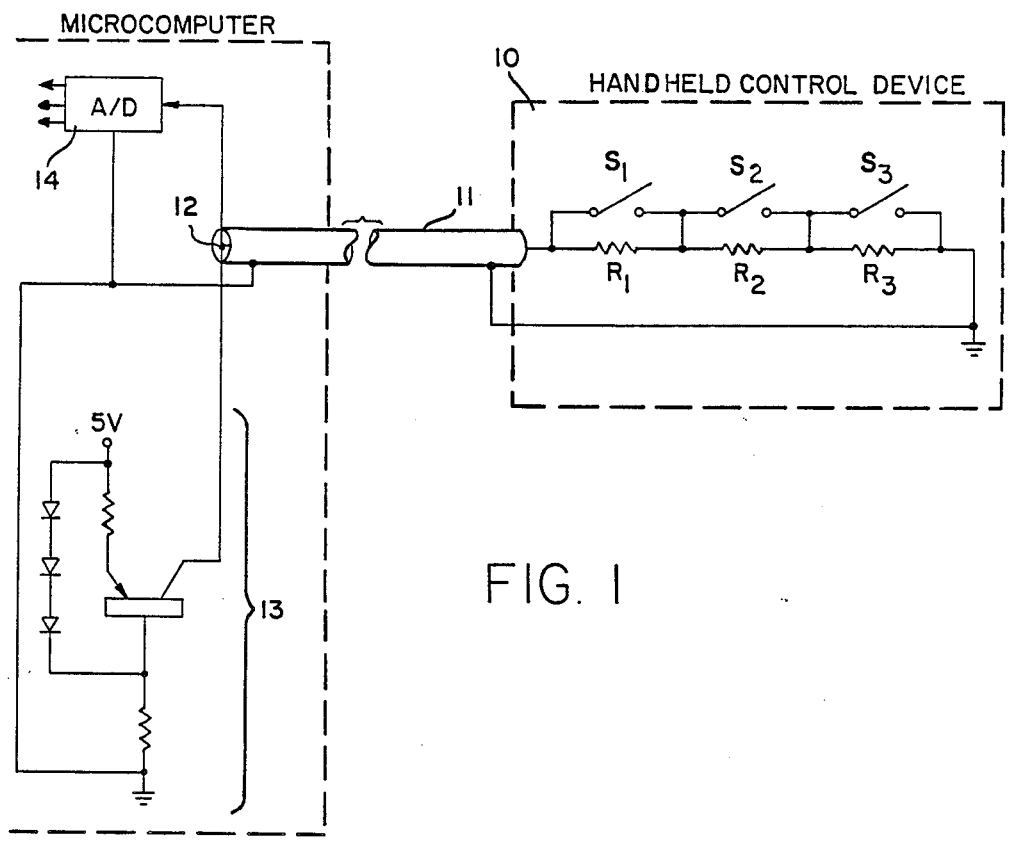
FIG. 1 illustrates a preferred embodiment of the present invention.

The invention shown in FIG. 1 is comprised of a handheld control device (box or handgrip) 10 which contains resistors $R_1$, $R_2$ and $R_3$ (weighted 200, 100 and 50 ohms) in series between ground and a single conductor coaxial cable 11. Switches $S_1$, $S_2$ and $S_3$ are connected in parallel with the respective weighted resistors $R_1$, $R_2$ and $R_3$. The center conductor of the cable 11 is connected to a node 12 at a circuit comprised of a constant current driver (CCD) 13 and an analog-to-digital (A/D) converter 14 which is part of a microcomputer system, or any digital computer system, programmed to decode the switch state information at the output of the converter 14. In that manner, the A/D converter demultiplexes the multiplexed signal received over the coaxial cable.

It should be noted that there are no active elements in the circuit at the control device which fulfills the switch-state multiplexing function, and that the digital-to-analog conversion voltage reference provided by the current driver is connected to the node 12 at the microcomputer system located on or in the apparatus to be controlled, such as a robot.

In operation, the state of each of the three switches is separately actuated to the closed or open position, such as by squeezing or releasing pushbutton microswitches mounted on a grip with any one of the three fingers between the thumb and little finger (or pushing the microswitches mounted on one side of a handheld box with the same three fingers). The constant current driver 13 provides a fixed current I through the weighted resistor $R_1$, $R_2$, and $R_3$ for a maximum output voltage $V = IR_0$, where $R_0$ is the sum of $R_1$, $R_2$, $R_3$. Closing any one of the switches $S_1$, $S_2$ and $S_3$ decreases the output voltage by $IR_1$, $IR_2$ and $IR_3$, respectively, with the minimum reference voltage at the node 12 being zero.

If the resistors are weighted in powers of the same value, the switch state configuration multiplexed on the single conductor cable can be uniquely inferred from the total voltage at the node 12 which is a linear function of the weighted resistors by-passed in the series circuit of the digital-to-analog converter by selectively closing one or more of the switches.

In some applications, the switch signal multiplexing method may be extended to fault tolerant redundant systems, such as fly-by-wire aircraft control systems, as an additional capability for the systems. In such systems, control integrity may be guaranteed by parallel microcomputer systems reading multiple sensors (analog-to digital converters) and driving multiple actuators. The switch signal multiplexing method saves weight by allowing several manually operated switches in a control device to be connected to a control computer via a single wire. This in itself should result in significant reliability gains through reduced component count. However, in life-critical control systems, such as flight control of commercial aircraft, safe operations must be guaranteed in spite of any single component failure.

Figure 2:
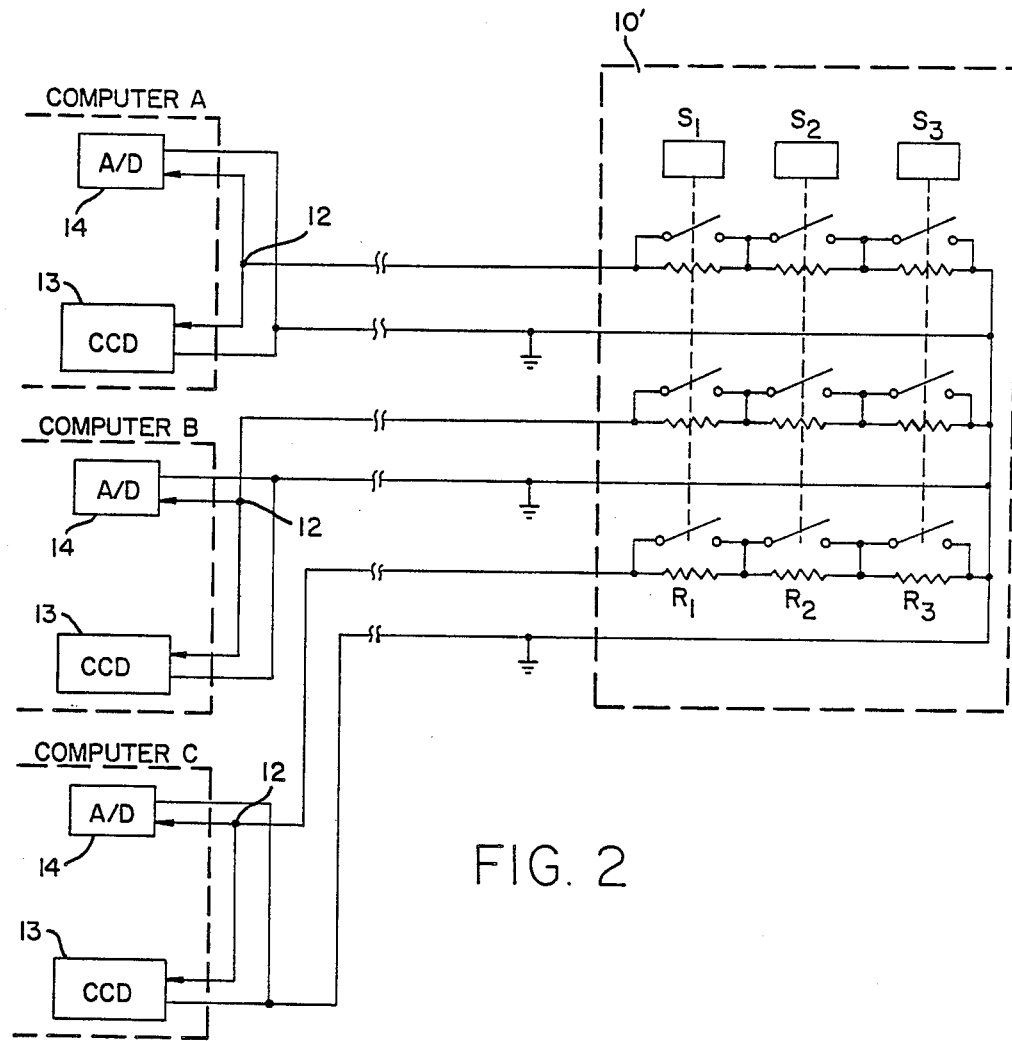
FIG. 2 illustrates application of the present invention to fault tolerant switch signal multiplexing to redundant control system in apparatus to be controlled.

The weight gains and reduced complexity benefits of the invention also apply to such redundant fault tolerant systems. FIG. 2 shows how such a system would be implemented with three level redundancy. For each operator switch $S_1$, $S_2$ and $S_3$, three sets of normally open contacts are mechanically coupled to the mechanism. One multiplexing circuit is formed for each contact position on each of the three switches as shown in FIG. 1. Each individual multiplexing circuit is driven by a separate current source with a separate power supply and fed to a separate control computer. The separate computers already exist in the fault-tolerant control system. Only the separate current sources are part of the invention. Thus, three sets of operator controlled switches are connected to a triply redundant control system with a three conductor cable. A comparable system without switch multiplexing requires 18, 12, or 10 wires, depending on ground wire requirements.

In FIG. 1, the ground wire is provided by the outer conductor of a coaxial cable. It could as well be provided by a second conductor in the same or separate insulating sheath. This second technique for providing the ground wire to each set of weighted resistors and switches is illustrated in FIG. 2.

The description of FIG. 1, which s applicable to FIG. 2 (as indicated by the same reference numerals used in the two figures) contemplates only multiplexing the switch states. It would be possible to multiplex an analog signal in place of one switch state, if the least significantly weighted resistor $R_3$ is used to transmit the analog value by substituting for a fixed resistor, a potentiometer which can be set by a thumb wheel, for example. This is possible because the most significant digits out of the digital-to-analog converter unambiguously code for the switches $S_1$ and $S_2$, while the least significant digit position of the converter determines an analog value being transmitted in a range from zero to $I(R_3max)$ as the resistor $R_3$ is increased in resistance from zero to a maximum value of resistance.

Figure 3:
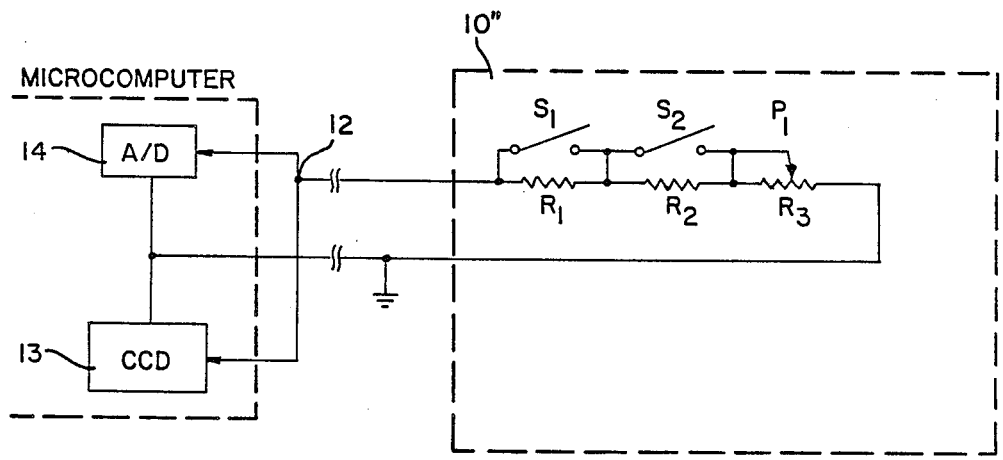
FIG. 3 illustrates a variation of the invention illustrated in FIG. 1.

The control computer reads the analog value by simply selecting the low order bits for the value of the analog quantity. For instance, as shown in FIG. 3, switch $S_1$ may be closed to specify forward speed control, while switch $S_2$ is left open. The desired speed set in the potentiometer $P_1$ is then multiplexed with the state of the switch $S_1$. For reverse speed, the switch $S_2$ may be used with the potentiometer $P_1$ set at some independent speed value. The operator simply resets the potentiometer before closing switch 2.

EXAMPLE

If the computer analog-to-digital converter has 12 bits of resolution to represent 0 to 10V, a unit quantization level equals:

If I=28.6MA,
The computer recognizes an analog-to-digital converted word as follows:

Low order bits of $P_1$ field may or may not be used depending on accuracy of $R_1$ and $R_2$, the current source, and the internal resistance of the current source.

Although particular embodiments of the invention have been described and illustrated herein, it is recognized that modifications and variations may readily occur to those skilled in the art. For example, although mechanical switches are shown, which may be microswitches, it would be possible to utilize electronic switches which are normally off and are turned on by grounding a control terminal with pushbuttons. Consequently, it is intended that the claims be interpreted to cover such modifications and variations.

I claim:

1. A system for multiplexing switch state signals from a device to a utilization system over a single conductor, comprising a series resistor network at said device, said network having n weighted resistors in series in which the resistances of said resistors are functions of different powers of the same base, each resistor except one having a switch in parallel therewith for bypassing it when the switch is closed, a source of constant current with internal resistance connected by said single conductor between circuit ground and one terminal of said series resistor network, a connection between a second terminal of said series resistor network opposite said one terminal and said circuit ground, and means connected to a node between said single conductor and said utilization device for converting the analog voltage at said device to a digital representation of the state of said switches in parallel with said resistors, said one resistor without a switch parallel therewith comprising a potentiometer connected in series with other ones of said n weighted resistors, said potentiometer being adjustable between a maximum resistance that is a function of the lowest power of the same base and a minimum resistance equal to zero.

2. Apparatus as defined in claim 1 wherein said device is a handheld controller for said utilization device.

3. A system for multiplexing switch state signals from a device to a utilization system over a single conductor, comprising a series resistor network at said device, said network having n weighted resistors in series in which the resistances of said resistors are functions of different powers of the same base, each resistor having a switch in parallel therewith for bypassing it when the switch is closed, a source of constant current with internal resistance connected by said single conductor between circuit ground and one terminal of said series resistor network, a connection between a second terminal of said series resistor network opposite said one terminal and said circuit ground, and means connected to a node between said single conductor and said utilization device for converting the analog voltage at said device to a digital representation of the state of said switches in parallel with said resistors, and further including redundancy in said utilization system for receiving multiplexed switch states at separate nodes between separate constant current drivers and circuit ground, and redundancy of series resistor networks at said device, each network having separate switches connected in parallel with respective ones of said resistors in series, means for operating switches of respective ones of said resistors in series to open or close in unison, and a plurality of separate conductors each connecting a separate one of said nodes with a separate one of said series resistor networks, thereby providing redundancy in said system for multiplexing switch states from said device to said utilization system.

4. Apparatus as defined in claim 3 wherein said device is a handheld controller for said utilization device.

* * * * *

UNITED STATES PATENT AND TRADEMARK OFFICE
CERTIFICATE OF CORRECTION

PATENT NO. : 4,884,070

DATED : November 28, 1989

INVENTOR(S) : Blake Hannaford

It is certified that error appears in the above-identified patent and that said Letters Patent is hereby corrected as shown below:

Column 3, lines 60-68, delete

"EXAMPLE

If the computer analog-to-digital converter has 12 bits of resolution to represent 0 to 10V, a unit quantization level equals:

if I=28.6MA,

The computer recognizes an analog-to-digital converted word as follows:"

and substitute

--Example: $R_3 = 0-50\Omega$, $R_2 = 100\Omega$, $R_1 = 200\Omega$

If the computer analog-to-digital converter has 12 bits of resolution to represent 0 to 10V, a unit quantization level equals:

$$\frac{10V}{2^{12}} = \frac{10}{8192} = 1.22MV$$

UNITED STATES PATENT AND TRADEMARK OFFICE
CERTIFICATE OF CORRECTION

PATENT NO. : 4,884,070

DATED : November 28, 1989

INVENTOR(S) : Blake Hannaford

It is certified that error appears in the above-identified patent and that said Letters Patent is hereby corrected as shown below:

If $I = 28.6 MA$, $$\text{potentiometer range} = \frac{.05 \times 28.6}{1.22 MV} = 1171 \text{ counts}$$

The computer recognizes an analog-to-digital converted word as follows:

| 11 | 10 | 9 | 8 | 7 | 6 | 5 | 4 | 3 | 2 | 1 | 0 |
|----|----|---|---|---|---|---|---|---|---|---|---|
| $S_1$ | $S_2$ | $P_1$ | | | | | | | | | |

$P_1$ range $= 0 \rightarrow 2^{11} - 1 = 0 \rightarrow 2047$ --

Signed and Sealed this

Seventeenth Day of September, 1991

*Attest:*

HARRY F. MANBECK, JR.

*Attesting Officer*  *Commissioner of Patents and Trademarks*